(12) United States Patent
Padiyath et al.

(10) Patent No.: US 8,507,086 B2
(45) Date of Patent: Aug. 13, 2013

(54) SEAMING TAPE AND METHOD OF SEALING WINDOW FILM SEAMS

(75) Inventors: Raghunath Padiyath, Woodbury, MN (US); Josh D. Tibbits, Cottage Grove, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 1951 days.

(21) Appl. No.: 11/614,672

(22) Filed: Dec. 21, 2006

(65) Prior Publication Data

US 2008/0149254 A1    Jun. 26, 2008

(51) Int. Cl.
*B32B 7/12* (2006.01)
*B32B 15/00* (2006.01)

(52) U.S. Cl.
USPC ........... 428/343; 428/344; 428/209; 428/189; 428/40.1; 428/906

(58) Field of Classification Search
USPC ............. 428/343, 344, 209, 189, 40.1, 906
See application file for complete search history.

(56) References Cited

U.S. PATENT DOCUMENTS

| | | | |
|---|---|---|---|
| 2,804,416 A * | 8/1957 | Phillipsen | 428/336 |
| 4,115,617 A * | 9/1978 | Mitsuishi et al. | 428/336 |
| 4,565,719 A | 1/1986 | Phillips et al. | |
| 4,645,714 A | 2/1987 | Roche et al. | |
| 4,873,139 A | 10/1989 | Kinosky | |
| 4,977,296 A | 12/1990 | Hemming | |
| 5,008,153 A | 4/1991 | Hayes | |
| 5,494,755 A * | 2/1996 | McCloskey | 428/344 |
| 5,506,059 A | 4/1996 | Robbins et al. | |
| 5,573,857 A | 11/1996 | Auger | |
| 5,925,453 A | 7/1999 | Kase et al. | |
| 5,956,175 A | 9/1999 | Hojnowski | |
| 6,007,901 A | 12/1999 | Maschwitz et al. | |
| 6,030,671 A | 2/2000 | Yang et al. | |
| 6,090,451 A | 7/2000 | Barth et al. | |
| 6,294,233 B1 | 9/2001 | Barth et al. | |
| 2003/0113534 A1 * | 6/2003 | Poisson | 428/343 |
| 2004/0126597 A1 * | 7/2004 | Cohen et al. | 428/458 |

* cited by examiner

*Primary Examiner* — Callie Shosho
*Assistant Examiner* — Samir Shah
(74) *Attorney, Agent, or Firm* — Jeffrey M. Olofson

(57) ABSTRACT

A corrosion resistant seaming tape includes a metal layer capable of blocking selected frequencies of electromagnetic radiation arranged on a polymeric substrate and covered with adhesive that protects the metal layer and prevents it from corroding. Also disclosed is a method of sealing a seam between adjacent edges of two adjacent pieces of window film including an internal metal layer by applying a polymeric film to the seam.

6 Claims, 2 Drawing Sheets

SEAMING TAPE AND METHOD OF SEALING WINDOW FILM SEAMS

BACKGROUND

The present invention relates generally to window films and, more particularly, to sealing the seam between the adjacent edges of window films including a metal layer.

Window films are commonly used in commercial buildings, residential homes, and in automotive applications to save energy, improve comfort, provide UV protection, prevent the leakage of high frequency communications signals from the structure, and to help reduce the dangers associated with window breakage. Window films are commercially available from 3M Company, St. Paul, Minn., under, for example, the Scotchtint window film product designation.

Many window film constructions include a metal layer, such as a vapor deposited layer of silver. High conductivity of the metal layer is desirable where the window film is to be used to prevent leakage of high frequency (e.g. 100 MHz-6 GHz) communication signals from the structure. In order to achieve a window film having the best combination of high conductivity, high transmission and high reflection, it is desirable to use pure silver for the metal layer.

Silver layers are highly prone to corrosion in the presence of atmospheric elements such as water and chlorine, particularly along the edges of the window film. That is, even though the layer of silver of a window film may be protected by a coating or a laminated film, the silver layer will be exposed to the corrosive elements of the surrounding environment along its edges. The corrosion process is accelerated with increased ambient temperature in the presence of salt and moisture. Corrosion is aesthetically undesirable and also interferes with the performance of the window film. To protect it from corrosion, the silver layer may be alloyed or sandwiched between layers of other metals, such as copper or gold. These corrosion protection methods, however, add cost to the window film, alter the appearance and optical transmission of the window film, and decrease the conductivity of the metal layer.

In many instances, a window film having low reflection in the visible part of the solar spectrum (400-800 nm) is desirable while maintaining a high degree of reflection in the near infrared (IR) range (800 nm-2500 nm). Multi-layer window film constructions having a dielectric/metal/dielectric in an A/B/A/B . . . type sequence may be made by tailoring the thickness of the individual layers such that the reflection in the visible range is suppressed. Such films are described in, for example, U.S. Pat. Nos. 6,007,901 (Maschwitz, et al.) and 6,391,400 (Russell, et al.).

In many applications, the size of the window exceeds the size of the available window film. For example, a window may be 84 inch×96 inch in size while the widest available window films typically have a width of only 60 inches. In such cases, more than one piece of window film is required to cover the entire glass pane, thereby resulting in a seam. Untreated seams are susceptible to corrosion when the window films contain metal layers, such as silver, and must, therefore, be protected. Typically, a thin bead of sealant is used to seal the seam in such cases. Such sealants, however, may allow infrared or other electromagnetic radiation to leak through the seam. A dark sealant material—which absorbs IR radiation—may be used to seal the seam, but the dark appearance of the sealant is often considered aesthetically objectionable.

U.S. Pat. No. 4,645,714 (Roche) discloses durable, specularly reflective mirrors for solar reflectors or fluorescent lamp fixtures that are formed by vapor-depositing silver on a polyester film and protectively covering it with a coating of transparent acrylate polymer containing a silver corrosion inhibitor such as glycol dimercaptoacetate.

U.S. Pat. No. 6,090,451 (Barth et al.) discloses edge sealing a window film by moving a porous applicator tip saturated with liquid sealant in wiping contact along an edge of the window film to be sealed so as to transfer a portion of the liquid sealant from the saturated applicator tip to the window film edge.

U.S. Pat. No. 6,294,233 (Barth et. al.) discloses transparent edge sealed window films. The edges of the window films are preferably sealed by a liquid solvated polymer material which, upon curing, provides a solid transparent seal which significantly minimizes the degradative effects of the ambient environment.

The need generally exists for a way to eliminate the problems of corrosion and/or unwanted leakage of electromagnetic radiation associated with seams formed by the adjacent edges of window films that include a metal layer. More specifically, the need exists for a sealing tape that prevents corrosion and unwanted leakage of electromagnetic radiation associated with such seams. The need also exists for a method that allows two individual sheets of window film to be applied to a window without creating a seam between the adjacent edges of the window films that is prone to corrosion. That is, the need exists for a method of applying at least two individual sheets of window film to a window, wherein at least one of the window films includes an internal metal layer, in a manner that the seam formed between the adjacent edges of the window films is protected or otherwise rendered corrosion resistant. The need also exists for a method of preventing IR radiation from leaking through such a seam. The need also exists for a fast, easy, inexpensive, and effective method of rendering a seam between adjacent edges of a window film corrosion resistant and resistant to IR leakage, and which does not otherwise interfere with the performance and/or appearance of the window film.

SUMMARY

The present invention generally provides a way to eliminate the problems of corrosion and/or unwanted leakage of electromagnetic radiation associated with seams formed by the adjacent edges of window film that include a metal layer. In one aspect, the present invention provides a sealing tape that prevents corrosion and unwanted leakage of electromagnetic radiation associated with such seams.

The present invention also provides a method that allows two individual sheets of window film to be applied to a window without creating a seam that is prone to corrosion where the adjacent edges of the window films meet. That is, the present invention provides a method of applying at least two individual sheets of window film to a window, wherein at least one of the window films includes an internal metal layer, in such a manner that the seam formed between the adjacent edges of the window films is protected or otherwise rendered corrosion resistant.

The present invention also provides a method of preventing IR radiation from leaking through such a seam. In addition, the present invention provides a fast, easy, inexpensive, and effective method of rendering a seam between adjacent edges of a window film corrosion resistant and resistant to IR leakage, and which does not otherwise interfere with the performance and/or appearance of the window film.

In one embodiment, the present invention provides a corrosion resistant seaming tape including a metal layer capable of blocking selected frequencies of electromagnetic radiation. The seaming tape includes a polymeric substrate having opposed first and second major surfaces, and opposed first and second side edges. The seaming tape further includes a metal layer arranged on the substrate first major surface. The metal layer has first and second side edges arranged in spaced relation with the substrate first and second side edges, whereby the substrate first major surface includes a central surface portion covered by the metal layer and further includes a pair of side surface portions adjacent to each side of the central surface portion that are not covered by the metal layer. The seaming tape further includes adhesive arranged on the substrate first major surface over the metal layer and further arranged over the substrate side surface portions, whereby the metal layer including the metal layer first and second side edges, and at least a portion of the substrate side surface portions, are coated with adhesive. In this manner, the adhesive surrounds all but the end edges of the metal layer, and thereby protects the metal layer from the corrosive elements of the surrounding environment, and thereby prevents the metal layer from corroding. In another aspect, the present invention provides a method of sealing a seam between adjacent edges of two pieces of window film applied to a window wherein at least one of the pieces of window film includes a metal layer, the method comprising the step of applying the above described tape to the seam.

In one embodiment, the metal layer is silver. In a more specific embodiment, the metal layer may comprise a metal layer arranged between a pair of polymeric layers. In another embodiment, the metal layer may be adhesively bonded with the substrate. In yet another embodiment, the substrate may be a film formed of polyethylene terephthalate (PET).

In another aspect, the present invention provides a method of sealing a window film seam formed by two adjacent pieces of window film—each having an internal metal layer—by applying a polymeric film over the seam. In another aspect, the method may further comprise the step of applying a sealant to the first and second ends of the film. In a specific aspect, the sealant may be a silicone sealant.

In a more specific aspect of the method, the polymeric film may include a substrate, a metal layer having a major surface opposite the substrate, opposed side edges and opposed end edges, and an adhesive arranged to cover the major surface and the opposed side edges of the metal layer.

In another aspect, the present invention provides a method of applying window film to a window comprising the step of first applying a first piece of window film to a first section of the window, wherein the window film includes a side edge that terminates in an interior region of the window, then applying a second piece of window film to a second section of the window adjacent the first section of the window, wherein the second window film includes a side edge arranged adjacent the side edge of the first piece of window film, thereby forming a seam with the first piece side edge, and then applying an elongate strip of corrosion resistant film having first and second ends over the seam created by the adjacent edges of the first and second pieces of window film.

In a more specific aspect, the corrosion resistant film may include a metal layer for preventing infrared radiation and high frequency signals from passing through the seam. In an even more specific aspect, the corrosion resistant film includes a polymeric substrate having opposed first and second major surfaces, and opposed first and second side edges, a metal layer arranged on the substrate first major surface, the metal layer having first and second side edges arranged in spaced relation with the substrate first and second side edges, whereby the substrate first major surface includes a central portion covered by the metal layer and includes edge surface portions that are not covered by the metal layer, and adhesive arranged on the substrate first major surface over the metal layer and arranged over the substrate edge surface portions, whereby the metal layer, the metal layer first and second side edges, and the substrate edge surface portions are coated with, and are generally surrounded by, adhesive.

In more specific aspects, the metal layer may be designed to block signals having a frequency of about 100 MHz to about 6 GHz. The method may further include the step of applying a sealant to the first and second ends of the sealing tape, and/or to the entire perimeter of the window films adjacent the window frame. The sealant may be, for example, a silicone sealant.

An advantage of certain embodiments of the present invention is that it eliminates the problems of corrosion and/or unwanted leakage of electromagnetic radiation associated with seams formed by the adjacent edges of window films that include a metal layer. Additional advantages of the present invention are that it provides a quick, easy, inexpensive, and effective method of rendering a seam between adjacent edges of a window film corrosion resistant and resistant to IR leakage, and which does not otherwise interfere with the performance and/or appearance of the window film.

BRIEF DESCRIPTION OF THE DRAWINGS

The present invention will be further described with reference to the accompanying drawings, in which.

DETAILED DESCRIPTION

Figure 1:
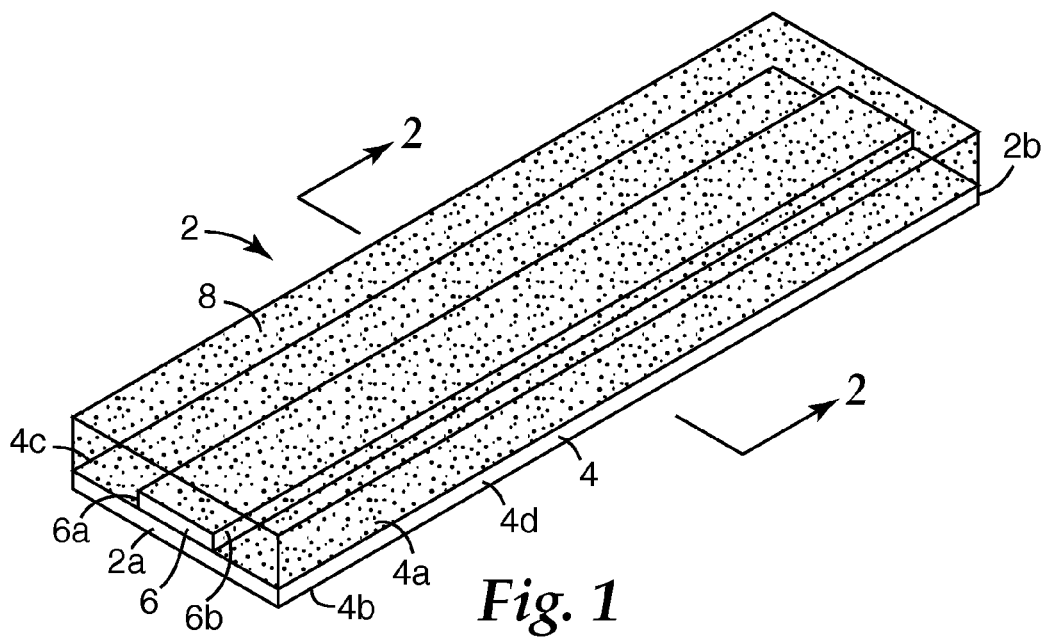
FIG. 1 is a perspective view of a seaming tape according to one aspect of the invention.
Figure 2:
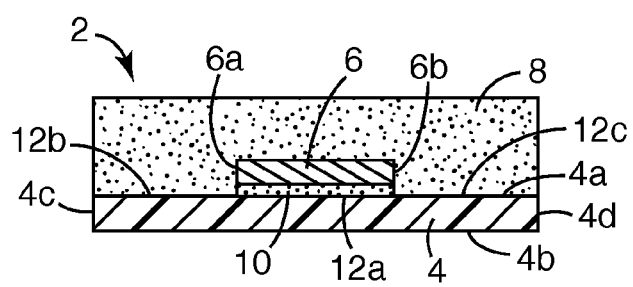
FIG. 2 is a cross sectional view taken of a along line 2-2 of FIG. 1.

Referring now to the drawings, FIGS. 1 and 2 show a film or tape 2 that can be used to seal a seam between two adjacent edges of window film. The tape 2 is generally intended to seal seams formed by window films having an internal metal layer. Such window films are well known in the art and are not described further. The tape 2 generally includes a polymeric substrate 4, a metal layer 6, and an adhesive 8 for adhesively bonding the tape 2 to a surface, such as the surface of a window film. The sealing tape 2 is effective at both preventing corrosion of the edges of the window film, and preventing or attenuating the passage of selected frequencies of electromagnetic radiation through the seam.

The polymeric substrate 4 includes opposed first and second major surfaces 4a, 4b, and opposed first and second side edges 4c, 4d. The polymeric substrate 4 may be formed of any suitable polymeric material such as, for example, polyethylene terephthalate (PET).

The metal layer 6 is arranged on the first major surface 4a of the substrate 4. The metal layer 6 may be adhesively bonded to the first major surface 4a of the substrate 4 using a suitable laminating adhesive 10, or the metal layer 6 may be formed directly on the first major surface 4a of the substrate 4. In accordance with one aspect of the invention, the metal layer 6 includes first and second side edges 6a, 6b that are arranged in spaced relation with respect to the first and second side edges 4c, 4d of the substrate 4. Arranged in this manner, the first major surface 4a of the substrate 4 includes a central surface portion 12a that is covered by the metal layer 6, and side surface portions 12b, 12c arranged adjacent each side of the central surface portion 12a that are not covered by the metal layer 6.

The adhesive 8 is arranged on the first major surface 4a of the substrate 4 over the metal layer 6 and on the side surface portions 12b, 12c of the substrate 4. Arranged in this manner, except at the ends 2a and 2b of the tape 2, all exposed surfaces (i.e. those surfaces not in contact with the substrate 4) of the metal layer 6—including the first and second side edges 6a, 6b—are surrounded by, or covered with, adhesive. In this manner, the adhesive 8 protects the metal layer 6 from the corrosive elements of the surrounding environment. In the illustrated embodiment, the adhesive 8 extends across the entire width of the side surface portions 12b, 12c of the substrate 4 to the side edges 4c, 4d of the substrate 4, but this is not necessary.

In one aspect of the invention, the tape 2 is optically clear, or closely matches the appearance of the window film to which it is applied, so as to be as inconspicuous as possible. That is, the substrate 4, the metal layer 6, the adhesive 8, and the laminating adhesive 10, if present, are selected so the visual impact of the tape 2, as applied to the seam, is minimized.

Figure 3:
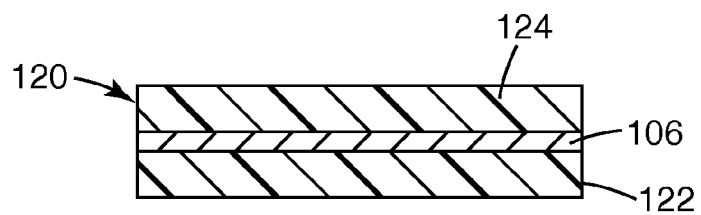
FIG. 3 is an enlarged cross sectional view of a simple form of a metal film that may be included in the seaming tape of FIG. 1.

Referring now to FIG. 3, there is shown a metal film 120 that can be incorporated into the tape 2 of FIGS. 1 and 2 in place of the metal layer 6. The metal film 120 includes a metal layer 106 arranged between a pair of polymeric layers 122, 124. This metal film 120 may be affixed directly to the substrate 4 by, for example, laminating, or it may be adhesively bonded to the substrate 4.

Figure 4:
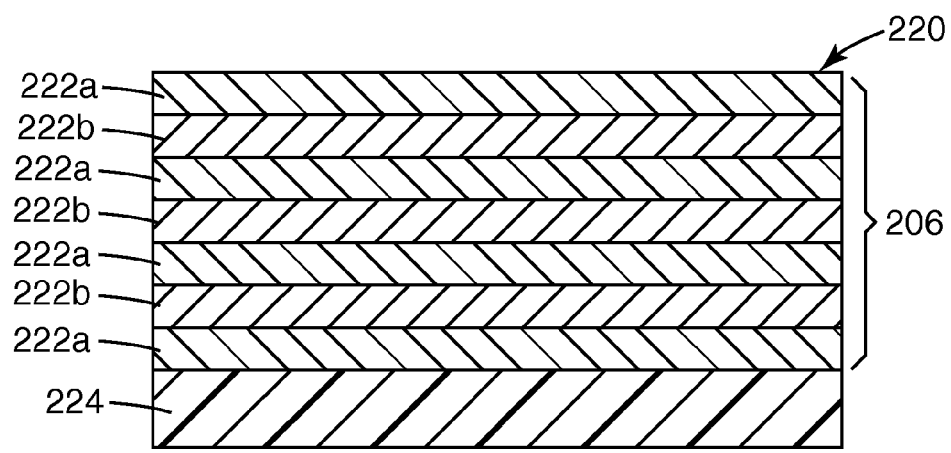
FIG. 4 is an enlarged cross sectional view of an alternate metal film that may be included in the seaming tape of FIG. 1.

Referring to FIG. 4, there is shown another metal film 220 that can be incorporated into the tape 2 of FIGS. 1 and 2 in place of the metal layer 6. The metal film 220 includes a metal layer 206 comprising a series of alternating layers of indium (III) oxide (InO) 222a and silver (Ag) 222b. Indium tin oxide (ITO) may be used in place of the InO. Adjacent the metal layer 206 is a polymeric substrate layer 224. The substrate layer 224 may be, for example, a two (2) mil layer of polyethylene terephthalate (PET). The combination of the metal layer 206 and the substrate layer 224 define a filtering film for attenuating electromagnetic waves in the frequency range from 100 MHz to 6 GHz and 120 GHz to 40 THz. Such films are described in, for example, U.S. Pat. No. 4,613,530 (Hood et al.) and U.S. Pat. No. 4,799,745 (Meyer et al.), which are incorporated herein by reference. Suitable films include the EMI/RFI shielding films available from Southwall Technologies, Palo Alto, Calif. A particular film suitable for the metal film 220 is XEM2.4 film available from Southwall Technologies. This metal film 220 may also be affixed directly to the substrate 4 by, for example, laminating, or it may be adhesively bonded to the substrate 4.

Figure 5:
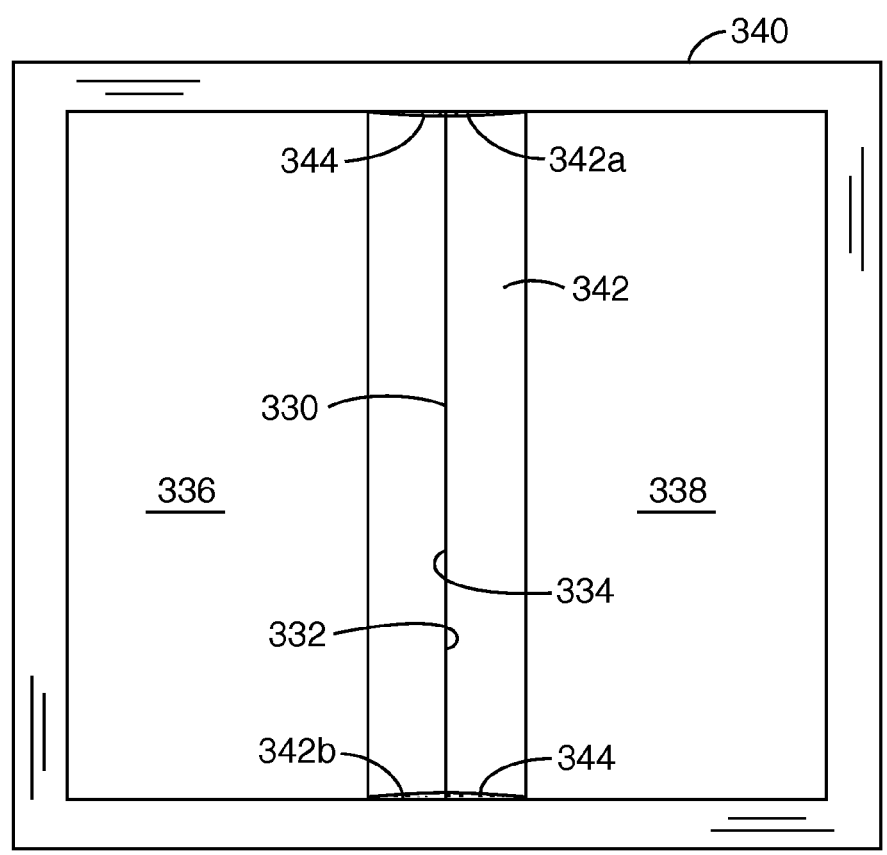
FIG. 5 is plan view of a window having a sealed seam according to another aspect of the invention.

Referring now to FIG. 5, in accordance with another aspect of the invention, there is shown a method of sealing a seam 330 formed between two adjacent edges 332, 334 of window films 336 338 applied to a window 340 in which the window films 332, 334 include an internal metal layer, such as a layer of silver. The method comprises the step of applying a polymeric film 342 over the seam 330. The polymeric film 342 is typically a single elongate strip of tape that extends along the entire length of the seam 330, and bridges the gap between the adjacent edges 332, 334 of window film that form the seam 330.

In one embodiment, the polymeric film 342 may comprise a polymeric substrate with an adhesive on one surface for adhering it to the window films 336, 338. Such a polymeric film 342 is effective at protecting the seam 330 or, more particularly, the edges 332, 334 of the window films 336, 338 that form the seam 330, from the surrounding ambient conditions that can cause the metal layer, which is exposed along the edges of the window film, to corrode. Thus, this embodiment provides a corrosion resistant seam 330.

In another embodiment, the polymeric film 342 may further comprise a metal layer. The polymeric film 342 may be, for example, any of the tapes/films described above in reference to FIGS. 1-4. That is, for example, the polymeric film 342 may have the construction of tape 2 which includes a substrate 4, a metal layer 6 having a major surface opposite the substrate 4 and opposed side edges and opposed end edges, and an adhesive 8 arranged to cover the major surface and opposed side edges of the metal layer 6. By providing a polymeric film 342 that includes a metal layer, the polymeric film 342 not only serves to protect the seam 330 from corrosion, but it also prevents unwanted electromagnetic radiation from passing through the seam 330.

If the polymeric film 342 includes a metal layer, the metal layer may be exposed at the ends of the polymeric film 342a, 342b, which would be prone to corrosion. In this case, the method may further comprise the step of applying a sealant 344 to the first 342a and second 342b ends of the polymeric film 342. If necessary, the sealant 344 may be applied along the entire perimeter of the window films adjacent the window frame. A suitable sealant is a silicone sealant, such as Dow Corning 995 silicone sealant available from the Dow Corning Corporation, Midland, Mich.

According to another aspect of the invention, window film is applied to the window 340 by applying a first piece of window film 336 to a first section of the window 340. The window film 336 includes a side edge 332 arranged in an interior region of the window 340. Next, a second piece of window film 338 is applied to a second section of the window 340 adjacent the first section of the window, wherein the second window film 338 includes a side edge 334 arranged adjacent the side edge 332 of the first piece of window film 336, thereby forming a seam 330 with the edge 332 of the first piece of window film 336. Next, an elongate strip of corrosion resistant film 342 having first 342a and second 342b ends is applied over the seam 330 created by the adjacent edges 332, 334 of the first 336 and second 338 pieces of window film.

In a specific embodiment, the polymeric film 342 includes a metal layer for preventing infrared radiation and high frequency signals from passing through the seam 330, such as the metal layers 106 and 206 shown and described in reference to FIGS. 3 and 4. In an even more specific embodiment, the metal layer blocks signals having a frequency of about 100 MHz to about 6 GHz as described above.

Persons of ordinary skill in the art may appreciate that various changes and modifications may be made to the invention described above without deviating from the inventive concept. Thus, the scope of the present invention should not be limited to the structures described in this application, but only by the structures described by the language of the claims and the equivalents of those structures.

What is claimed is:

1. A corrosion resistant seaming tape including a metal layer capable of blocking selected frequencies of electromagnetic radiation, comprising:
    (a) a polymeric substrate having opposed first and second major surfaces, and opposed first and second side edges;
    (b) a metal layer arranged on the substrate first major surface, the metal layer having first and second side edges arranged in spaced relation with the substrate first and second side edges, whereby the substrate first major surface includes a central surface portion covered by the metal layer and further includes a pair of side surface portions adjacent each side of the central surface portion that are not covered by the metal layer; and (c) adhesive arranged on the substrate first major surface over the metal layer and arranged over the substrate side surface portions, whereby the metal layer, the metal layer first and second side edges, and at least a portion of the substrate side surface portions are coated with adhesive, wherein the tape is optically clear.

2. The seaming tape as defined in claim 1, wherein the metal layer comprises a metal layer arranged between a pair of polymeric layers.

3. The seaming tape as defined in claim 1, wherein the metal layer is adhesively bonded with the substrate.

4. The seaming tape as defined in claim 1, wherein the substrate is a film formed of polyethylene terephthalate (PET).

5. The seaming tape as defined in claim 1, wherein the metal layer consists essentially of silver.

6. A method of sealing a seam between adjacent edges of two pieces of window film applied to a window wherein at least one of the pieces of window film includes a metal layer, the method comprising the step of applying the seaming tape of claim 1 over the seam.

\* \* \* \* \*